US010927470B2

(12) United States Patent
Cheong

(10) Patent No.: US 10,927,470 B2
(45) Date of Patent: Feb. 23, 2021

(54) APPARATUS FOR FABRICATING ELECTRODE STRUCTURE

(71) Applicant: ELECTRONICS AND TELECOMMUNICATIONS RESEARCH INSTITUTE, Daejeon (KR)

(72) Inventor: Woo-Seok Cheong, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 123 days.

(21) Appl. No.: 15/952,738

(22) Filed: Apr. 13, 2018

(65) Prior Publication Data

US 2019/0055662 A1  Feb. 21, 2019

(30) Foreign Application Priority Data

Aug. 18, 2017  (KR) .................. 10-2017-0105045

(51) Int. Cl.
  *C25D 5/04*  (2006.01)
  *H05K 3/18*  (2006.01)
  (Continued)

(52) U.S. Cl.
  CPC .............. *C25D 5/04* (2013.01); *C25D 3/38* (2013.01); *C25D 5/022* (2013.01); *C25D 7/0635* (2013.01); *C25D 7/0642* (2013.01); *C25D 7/123* (2013.01); *C25D 21/10* (2013.01); *C25D 21/11* (2013.01); *G03F 7/164* (2013.01); *H05K 3/188* (2013.01); *H05K 3/241* (2013.01); *H05K 1/0274* (2013.01);
  (Continued)

(58) Field of Classification Search
  CPC . C25D 3/38; C25D 5/022; C25D 5/04; C25D 7/0635; C25D 7/0642; C25D 7/123; C25D 21/10; C25D 21/11; G03F 7/164; H05K 1/0274; H05K 3/188; H05K 3/241; H05K 2201/0108; H05K 2201/0326; H05K 2201/09681; H05L 2203/0121; H05L 2203/0562; H05L 2203/0723; H05L 2203/1545
  See application file for complete search history.

(56) References Cited

U.S. PATENT DOCUMENTS 4,661,213 A * 4/1987 Dorsett .............. C25D 7/0642
                                                   205/50
4,762,599 A * 8/1988 Damiron ............ C25D 7/0614
                                                   204/206
(Continued)

FOREIGN PATENT DOCUMENTS

JP   2010-211647 A   9/2010
JP   2010-211823 A   9/2010
(Continued)

*Primary Examiner* — Louis J Rufo

(57) ABSTRACT

An apparatus for fabricating an electrode structure includes a high voltage unit, a plating material part facing the high voltage unit, and a transfer roll to which a negative voltage is applied. The high voltage unit includes a high voltage roll, and an insulating sheath configured to cover a surface of the high voltage roll. The high voltage roll is applied with a voltage of about 1 kV to about 100 kV, the plating material part is applied with a positive voltage, and the high voltage unit and the transfer roll rotate.

18 Claims, 11 Drawing Sheets

(51) Int. Cl.
*C25D 3/38* (2006.01)
*C25D 5/02* (2006.01)
*C25D 7/12* (2006.01)
*C25D 21/11* (2006.01)
*G03F 7/16* (2006.01)
*C25D 21/10* (2006.01)
*C25D 7/06* (2006.01)
*H05K 3/24* (2006.01)
*H05K 1/02* (2006.01)

(52) U.S. Cl.
CPC ........... *H05K 2201/0108* (2013.01); *H05K 2201/0326* (2013.01); *H05K 2201/09681* (2013.01); *H05K 2203/0121* (2013.01); *H05K 2203/0562* (2013.01); *H05K 2203/0723* (2013.01); *H05K 2203/1545* (2013.01)

(56) References Cited

U.S. PATENT DOCUMENTS

| | | | |
|---|---|---|---|
| 5,164,059 A * | 11/1992 | Geiermann | C25D 7/0635 204/206 |
| 5,783,058 A * | 7/1998 | Fowler | C25D 17/12 205/205 |
| 5,861,327 A | 1/1999 | Maeng et al. | |
| 6,153,489 A | 11/2000 | Park et al. | |
| 8,529,738 B2 * | 9/2013 | Von Gutfeld | C25D 5/022 204/242 |
| 8,605,038 B2 | 12/2013 | Cho | |
| 8,605,055 B2 | 12/2013 | Han | |
| 8,633,903 B2 | 1/2014 | Kim et al. | |
| 8,872,786 B2 | 10/2014 | Matsuo | |
| 2006/0151315 A1 * | 7/2006 | Yang | C25D 7/0628 204/202 |
| 2009/0032404 A1 * | 2/2009 | Tachi | C25D 7/0614 205/143 |
| 2010/0231542 A1 | 9/2010 | Momose | |
| 2012/0241325 A1 * | 9/2012 | Huebel | C25D 7/0657 205/80 |

FOREIGN PATENT DOCUMENTS

| | | |
|---|---|---|
| JP | 2010-257492 A | 11/2010 |
| KR | 10-0787279 B1 | 12/2007 |
| KR | 10-2008-0054318 A | 6/2008 |
| KR | 10-2009-0059726 A | 6/2009 |
| KR | 10-2010-0051292 A | 5/2010 |
| KR | 10-2010-0065486 A | 6/2010 |
| KR | 10-2010-0073546 A | 7/2010 |
| KR | 10-2010-0095886 A | 9/2010 |
| KR | 10-2010-0131076 A | 12/2010 |
| KR | 10-2011-0000722 A | 1/2011 |
| KR | 10-2011-0000985 A | 1/2011 |
| KR | 10-1066111 B1 | 9/2011 |
| WO | 2008072900 A1 | 6/2008 |

* cited by examiner

APPARATUS FOR FABRICATING ELECTRODE STRUCTURE

CROSS-REFERENCE TO RELATED APPLICATIONS

This U.S. non-provisional patent application claims priority under 35 U.S.C. § 119 of Korean Patent Application No. 10-2017-0105045, filed on Aug. 18, 2017, the entire contents of which are hereby incorporated by reference.

BACKGROUND

The present disclosure herein relates to an apparatus for fabricating an electrode structure, and more particularly, to an apparatus for fabricating an electrode structure using a roll-to-roll method.

An indium-tin oxide (ITO) is a representative transparent electrode as a transparent conductive oxide (TCO) made of a single material. The ITO has a light transmission rate equal to or greater than about 85% and a surface resistance of about 100Ω/□. The transparent electrode used for a next generation touch sensor is required to have a light transmission rate equal to or greater than about 90% and a surface resistance equal to or less than about 10Ω/□. The transparent electrode used for a next generation transparent heater is required to have a light transmission rate equal to or greater than about 90% and a surface resistance equal to or less than about 1Ω/□.

In the field of using the transparent electrode, the transparent electrode including a metal mesh is a competitive technology in optical and electrical aspects. A method for forming the transparent electrode includes electroless plating, a printing technique, self-patterning, and photo-lithography.

SUMMARY

The present disclosure provides improved uniformity of plating.

The present disclosure also provides a mass-production of an electrode structure.

The present disclosure may, however, be embodied in different forms and should not be construed as limited to the embodiments set forth herein.

An embodiment of the inventive concept provides an apparatus for fabricating an electrode structure including: a high voltage unit; a plating material part facing the high voltage unit; and a transfer roll to which a negative voltage is applied. Here, the high voltage unit includes: a high voltage roll; and an insulating sheath configured to cover a surface of the high voltage roll, and a positive voltage is applied to the plating material part.

In an exemplary embodiment, the plating material part may have a curved plate shape.

In an exemplary embodiment, a distance between the plating material part and the high voltage roll may be constant.

In an exemplary embodiment, the plating material part may have a uniform thickness.

In an exemplary embodiment, the plating material part may include holes passing therethrough.

In an exemplary embodiment, the holes may have a surface area that is equal to or less than about 50% of an entire surface area of the plating material part.

In an exemplary embodiment, a seed film may be disposed between the transfer roll and the high voltage unit and between the high voltage unit and the plating material part, the seed film may include: a substrate; and a seed pattern provided on a top surface of the substrate, and the seed pattern may be electrically connected to the transfer roll and applied with the negative voltage.

In an exemplary embodiment, the seed pattern may have a thickness of about 10 nm to about 20 nm.

In an exemplary embodiment, the apparatus may further include: a housing surrounding the high voltage unit, the plating material part, and the transfer roll; and an electrolyte provided in the housing, and a lower portion of the high voltage unit and the plating material part may be dipped into the electrolyte.

In an exemplary embodiment, the plating material part may include copper (Cu), and the electrolyte may include a copper sulfate aqueous solution.

In an exemplary embodiment, the apparatus may further include a circulation device configured to circulate the electrolyte.

In an exemplary embodiment, the insulation sheath may include an insulation material, and the high voltage roll may be electrically separated from the seed film and the electrolyte by the insulation sheath.

In an exemplary embodiment, the apparatus may further include: a photoresist developing device; and a photoresist removing device, a seed film may be disposed in the photoresist developing device, the electroplating device, and the photoresist removing device, and the seed film may be controlled to sequentially pass through the photoresist developing device, between the transfer roll and the high voltage unit, between the high voltage unit and the plating material part, and the photoresist removing device.

In an exemplary embodiment, the high voltage roll may be applied with a voltage of about 1 kV to about 100 kV.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
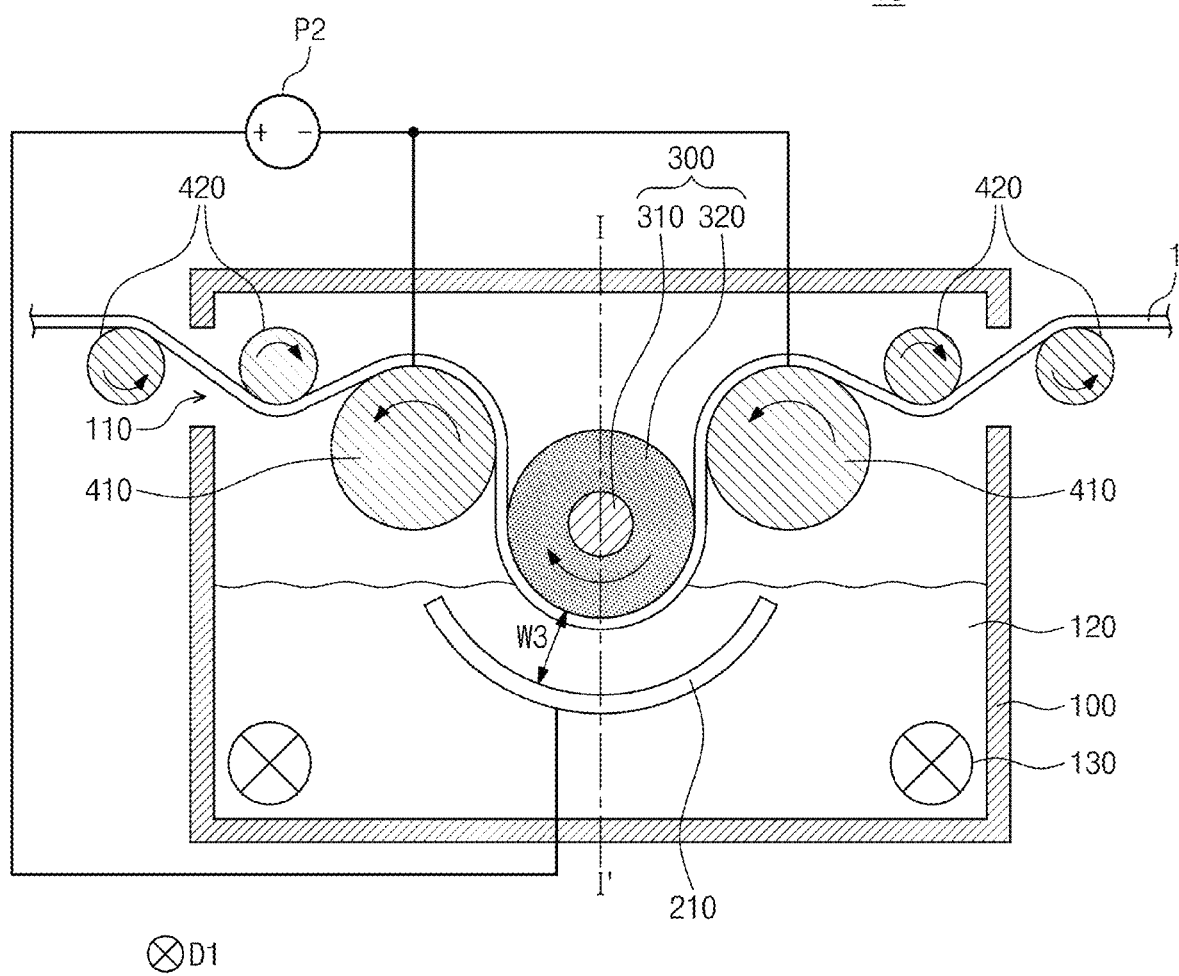
FIG. 1 is a conceptual view of an apparatus for fabricating an electrode structure according to exemplary embodiments of the inventive concept.

Exemplary embodiments of technical ideas of the inventive concept will be described with reference to the accompanying drawings so as to sufficiently understand constitutions and effects of the inventive concept. The exemplary embodiments of the inventive concept may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

Like reference numerals refer to like elements throughout. The embodiment in the detailed description will be described with sectional views and/or plain views as ideal exemplary views of the present invention. In the figures, the dimensions of regions are exaggerated for effective description of the technical contents. Areas exemplified in the drawings have general properties, and are used to illustrate a specific shape of a semiconductor package region. Thus, this should not be construed as limited to the scope of the present invention. It will be understood that although the terms first and second are used herein to describe various elements, these elements should not be limited by these terms. These terms are only used to distinguish one component from another component. Embodiments described and exemplified herein include complementary embodiments thereof.

In the following description, the technical terms are used only for explaining a specific exemplary embodiment while not limiting the inventive concept. In this specification, the terms of a singular form may include plural forms unless specifically mentioned. The meaning of 'comprises' and/or 'comprising' does not exclude other components besides a mentioned component.

Hereinafter, the present invention will be described in detail by explaining preferred embodiments of the invention with reference to the attached drawings.

Figure 2:
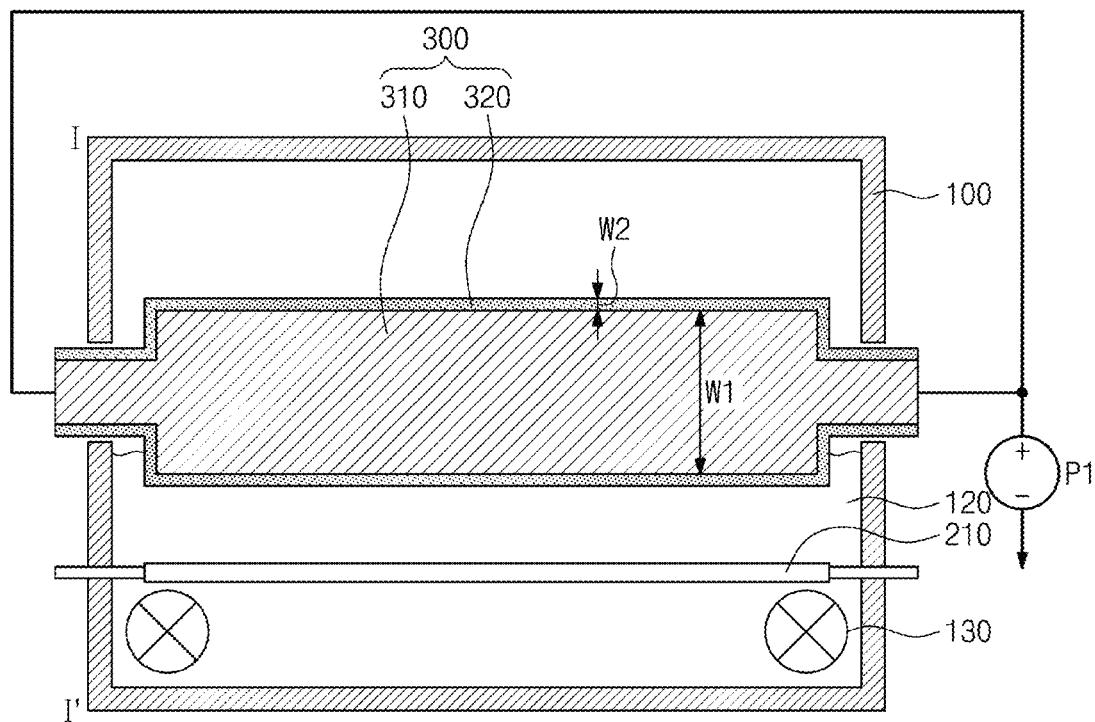
FIG. 2 is a cross-sectional view taken along line I-I' of FIG. 1.
Figure 3:
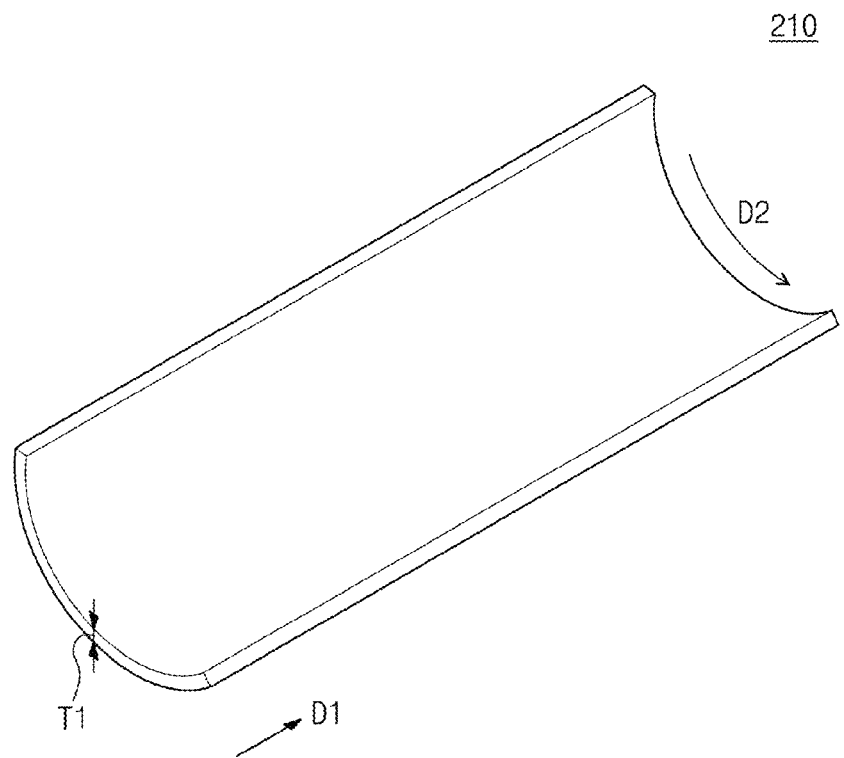
FIG. 3 is a perspective view of a plating material part according to exemplary embodiments of the inventive concept.
Figure 4:
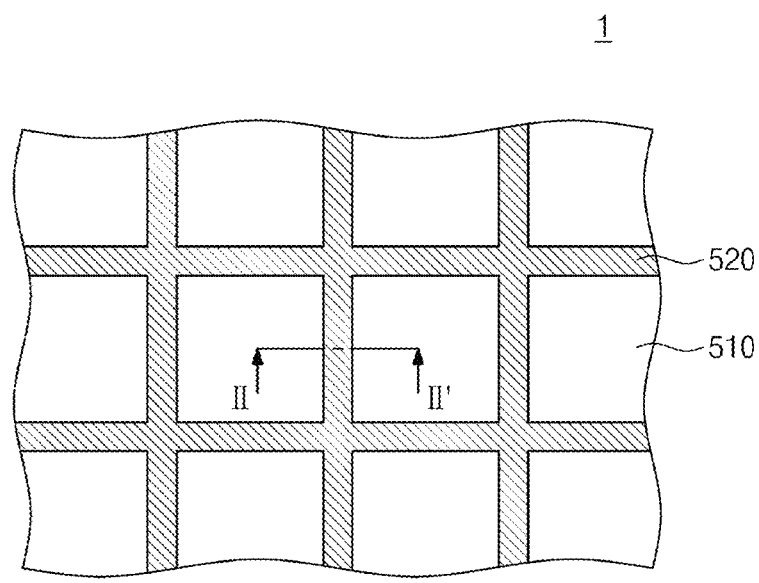
FIG. 4 is a plan view for explaining a seed pattern according to exemplary embodiments of the inventive concept.
Figure 5:
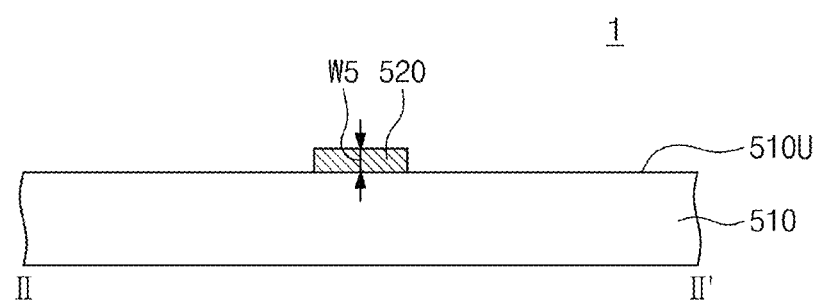
FIG. 5 is a cross-sectional view taken along line II-II' of FIG. 4.
Figure 6:
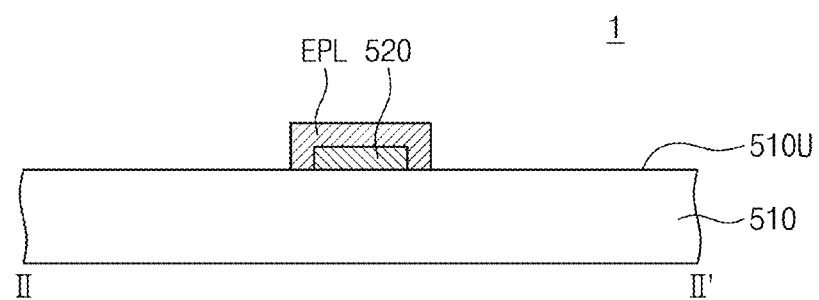
FIG. 6 is a cross-sectional view taken along line II-II' of an electrode structure formed through an electroplating process.

FIG. 1 is a conceptual view of an apparatus for fabricating an electrode structure according to exemplary embodiments of the inventive concept. FIG. 2 is a cross-sectional view taken along line I-I' of FIG. 1. FIG. 3 is a perspective view a plating material part according to exemplary embodiments of the inventive concept. FIG. 4 is a plan view for explaining a seed pattern according to exemplary embodiments of the inventive concept. FIG. 5 is a cross-sectional view taken along line II-II' of FIG. 4. FIG. 6 is a cross-sectional view taken along line II-II' of an electrode structure formed through an electroplating process.

Referring to FIGS. 1 and 2, an apparatus for fabricating an electrode structure 10 (hereinafter, referred to as an electrode structure fabricating apparatus) including a housing 100 may be provided. The housing 100 may include a pair of openings 110. The pair of openings 110 may be defined in both side walls (e.g., sidewalls facing each other) of the housing 100. A seed film 1 that will be described later may pass through the housing 100 through the pair of openings 110. Here, the number of the openings is not limited. In other exemplary embodiments, the housing 100 may include more than two openings 110.

An electrolyte 120 may be provided in the housing 100. The electrolyte 120 may be provided below the pair of openings 110. The electrolyte 120 may include an aqueous solution including a metallic element that is included in a plating material part 210 that will be described later. For example, when the plating material part 210 includes copper (Cu), the electrolyte 120 may include a copper sulfate aqueous solution.

A circulation device 130 may be provided in the electrolyte 120. The circulation device 130 may circulate the electrolyte 120 to mix the electrolyte 120.

A high voltage unit 300 may be provided in the housing 100. The high voltage unit 300 may rotate. The high voltage unit 300 may include a high voltage roll 310 and an insulation sheath 320 covering a surface of the high voltage roll 310. A lower portion of the high voltage unit 300 may be dipped into the electrolyte 120.

In exemplary embodiments, the high voltage roll 310 may have a cylindrical shape. For example, the high voltage roll 310 may have a diameter W1 of about 2 cm to about 100 cm. The high voltage roll 310 may include a conductive material. For example, the high voltage roll 310 may include copper (Cu), aluminum (Al), gold (Au), or silver (Ag).

The insulation sheath 320 may be provided on a surface of the high voltage roll 310. In exemplary embodiments, the insulation sheath 320 may have a thickness W2 of about 1 mm to about 10 mm. The insulation sheath 320 may separate the high voltage roll 310 from the electrolyte 120 and the seed film 1. The insulation sheath 320 may electrically separate the high voltage roll 310 from the electrolyte 120 and the seed film 1. For example, the insulation sheath 320 may include rubber, insulative plastic, or glass.

A first power P1 electrically connected to the high voltage roll 310 may be provided. The first power P1 may be a direct current power. The first power P1 may apply a high voltage to the high voltage roll 310. For example, the first power P1 may apply a voltage of about 1 kV to about 100 kV to the high voltage roll 310.

The plating material part 210 may be provided in the electrolyte 120. The plating material part 210 may be completely dipped into the electrolyte 120. That is, entire plating material part 210 may be surrounded by the electrolyte 120. However, this is an exemplary embodiment. In other exemplary embodiments, one portion of the plating material part 210 is dipped into the electrolyte 120, and another portion of the electrolyte 120 may be exposed outside the electrolyte.

Referring to FIGS. 1 and 3, the plating material part 210 may have a curved plate shape. For example, the plating material part 210 may extend along a circumferential direction D2 of the high voltage roll 310 to have a curved shape. A distance W3 between the plating material part 210 and the high voltage roll 310 may be constant. For example, the distance between the plating material part 210 and the high voltage roll 310 may be about 5 mm to about 500 mm. The plating material part 210 may extend in a first direction D1.

The plating material part 210 may have a uniform thickness T1. The thickness T1 of the plating material part 210 may be a distance between top and bottom surfaces of the plating material part 210. The top surface of the plating material part 210 faces the high voltage roll 310, and the bottom surface of the plating material part 210 is disposed opposite to the top surface. For example, the plating material part 210 may have a thickness T1 of about 0.5 mm to about 10 mm. The plating material part 210 may include a material to be applied on a surface of the seed pattern that will be described later. For example the plating material part 210 may include gold (Au), silver (Ag), copper (Cu), indium (In), or nickel (Ni).

Referring to FIGS. 1 and 2 again, a pair of first transfer rolls 410 may be provided adjacent to the high voltage roll 310. The pair of first transfer rolls 410 may be spaced apart from the electrolyte 120. For example, the pair of first transfer rolls 410 may be disposed above an uppermost portion of the electrolyte 120. Accordingly, the pair of first transfer rolls 410 may be electrically separated from the electrolyte 120. In exemplary embodiments, each of the pair of first transfer rolls 410 may have a cylindrical shape extending in the first direction D1. For example, each of the pair of first transfer rolls 410 may have a diameter of about 2 cm to about 100 cm. The pair of first transfer rolls 410 may include a conductive material. For example, the pair of first transfer rolls 410 may include a copper (Cu) roll, an aluminum (Al) roll, a gold (Au) coating layer, or a silver (Ag) coating film.

A second power P2 electrically connected to the first transfer rolls 410 and the plating material part 210 may be provided. The second power P2 may be a direct current power. The second power P2 may have a positive voltage terminal that is electrically connected to the plating material part 210. Accordingly, the plating material part 210 may have a positive voltage. Here, the positive voltage may have a level less than that of the high voltage applied to the high voltage roll 310. For example, the positive voltage may have a level less than about 1 kV. The second power P2 may have a negative voltage terminal that is electrically connected to the pair of first transfer rolls 410. Accordingly, each of the pair of first transfer rolls 410 may have a negative voltage.

The seed film 1 may be provided on the insulation sheath 320. The seed film 1 may be provided between the insulation sheath 320 and the plating material part 210. As illustrated in FIGS. 4 and 5, the seed film 1 may include a substrate 510 and a seed pattern 520 defined on a top surface 510u of the substrate 510. The top surface 510u may face the plating material part 210. The top surface 510u may be exposed to the electrolyte 120 and contact the surface of the first transfer roll 410. The substrate 510 may have a bottom surface contacting the insulation sheath 320. The substrate 510 may include a flexible material. For example, the substrate 510 may include a flexible polymer (e.g., polycarbonate (PC) and polyethylene terephthalate (PET) or polyimide (PI)).

In exemplary embodiments, the seed pattern 520 may be disposed in a grid shape on the top surface 510u of the substrate 510. In exemplary embodiments, the seed pattern 520 may have a thickness W5 of about 10 nm to about 20 nm. The seed pattern 520 may include a conductive material. For example, the seed pattern 520 may include at least one selected from the group consisting of silver (Ag), a silver alloy (Ag alloy) including aluminum (Al), molybdenum (Mo), gold (Au), palladium (Pd), titanium (Ti), copper (Cu), and a combination thereof. The seed pattern 520 may be electrically connected to the first transfer roll 410. The seed pattern 520 may have the same negative voltage as that of the first transfer roll 410.

Referring to FIGS. 1 and 6, a plating material is applied on the seed pattern 520 to provide a plating layer EPL. For example, when the plating material part 210 includes copper (Cu), and the electrolyte 120 is a copper sulfate aqueous solution, the plating layer EPL including copper (Cu) may be provided on a surface of the seed pattern 520. The plating layer EPL may cover the surface of the seed pattern 520. Accordingly, the electrode structure including the substrate 510, the seed pattern 520, and the plating layer EPL may be provided. Second transfer rolls 420 may be provided inside and outside the housing 100. The second transfer rolls 420 may rotate to move the seed film 1.

In general, an electroplating process may be independently performed on each of a plurality of electrodes unlike a roll-to-roll process. In this case, the electroplating process is discontinuously performed to require a large amount of processing time. When the electrode structure fabricating apparatus according to an embodiment of the inventive concept is used, the electroplating process may be continuously performed in virtue of the roll-to-roll process to minimize the processing time.

Since a surface area of the plating layer is affected by a size of the electrode structure fabricating apparatus, the plating layer having a large surface area has difficulty in fabrication. However, the plating layer according to an embodiment of the inventive concept may be provided larger in size than the electrode structure fabricating apparatus. That is, the plating layer having a large surface area may be provided.

The thickness of the plating layer may have a degree of uniformity that is proportional to that of an electron distribution in the seed pattern. For example, when the electron distribution uniformity in the seed pattern is high, a thickness uniformity of the plating layer may be high, and, when the electron distribution uniformity in the seed pattern is low, the thickness uniformity of the plating layer may be low. That is, when the electron distribution uniformity in the seed pattern is ununifrom, the plating layer may not have a uniform thickness. The high voltage unit according to an embodiment of the inventive concept may maximize the electron uniformity in the seed pattern. Accordingly, the thickness uniformity of the plating layer may be maximized.

Figure 7:
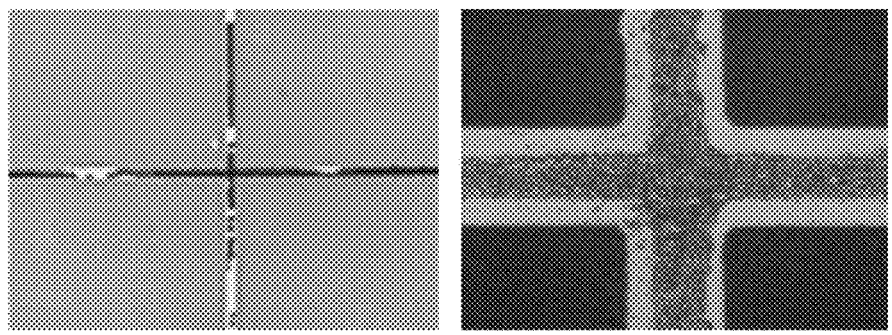
FIG. 7 is a photograph showing a result obtained by performing an electroplating process by using an apparatus for fabricating an electrode structure excluding a high voltage unit.

FIG. 7 is a photograph showing a result obtained by performing an electroplating process by using an electrode structure fabricating apparatus excluding the high voltage unit.

Referring to FIG. 7, the seed pattern has a cross-shape. The plating layer is provided on a portion (dark portion) of the seed pattern and is not provided on another portion (bright portion) of the seed pattern. That is, it may be seen that the plating layer is ununiformly provided on the seed pattern.

Figure 8:
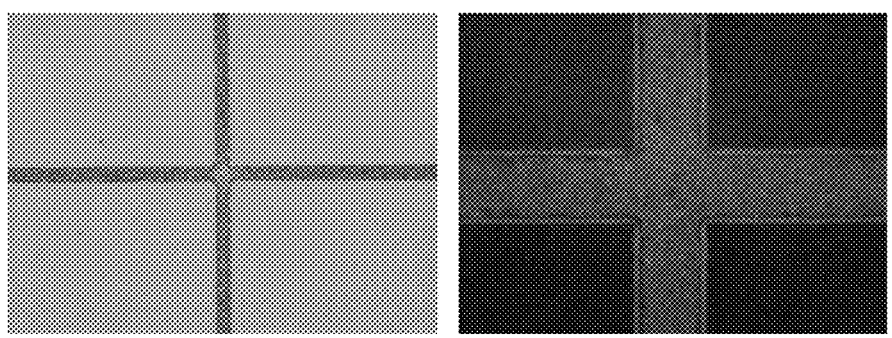
FIG. 8 is a photograph showing a result obtained by performing an electroplating process by using an apparatus for fabricating an electrode structure including a high voltage unit according to exemplary embodiments of the inventive concept.

FIG. 8 is a photograph showing a result obtained by performing an electroplating process by using the electrode structure fabricating apparatus including the high voltage unit according to exemplary embodiments of the inventive concept.

Referring to FIG. 8, it may be seen that the plating layer is uniformly provided on the seed pattern.

Figure 9:
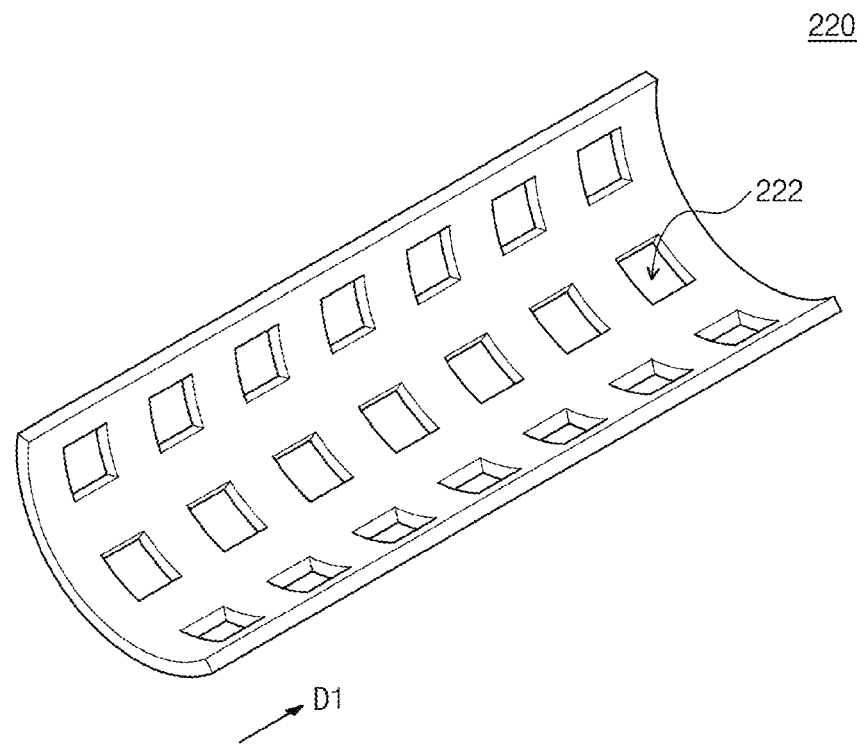
FIG. 9 is a perspective view a plating material part according to exemplary embodiments of the inventive concept.

FIG. 9 is a perspective view of the plating material part according to exemplary embodiments of the inventive concept. For concise description, the substantially same contents as those described with reference to FIG. 3 will not be described.

Referring to FIG. 9, a plating material part 220 having a curved plate shape may be provided. The plating material part 220 may be substantially the same as the plating material part 210 described with reference to FIG. 3 except for holes 222. The holes 222 may pass through the plating material part 220. For example, the holes 222 may extend from a top surface to a bottom surface of the plating material part 220 to pass through the plating material part 220. The holes 222 may be defined in a surface area equal to or less than about 50% of an entire surface area of the plating material part 220. An arrangement type of the holes 222 is exemplarily illustrated, but not limited thereto. Inside surfaces of the plating material part 220 may be exposed through the holes 222. Accordingly, a surface area, which contacts the electrolyte 120, of the plating material part 220 may be maximized. As the surface area of the plating material part 220 increases, a plating efficiency may increase. The plating efficiency of the electroplating process may be enhanced by the plating material part 220 according to an embodiment of the inventive concept.

FIGS. 10 to 15 are cross-sectional views respectively illustrating seed films according to exemplary embodiments of the inventive concept. For concise description, the substantially same contents as those described with reference to FIG. 4 will not be described.

Figure 10:
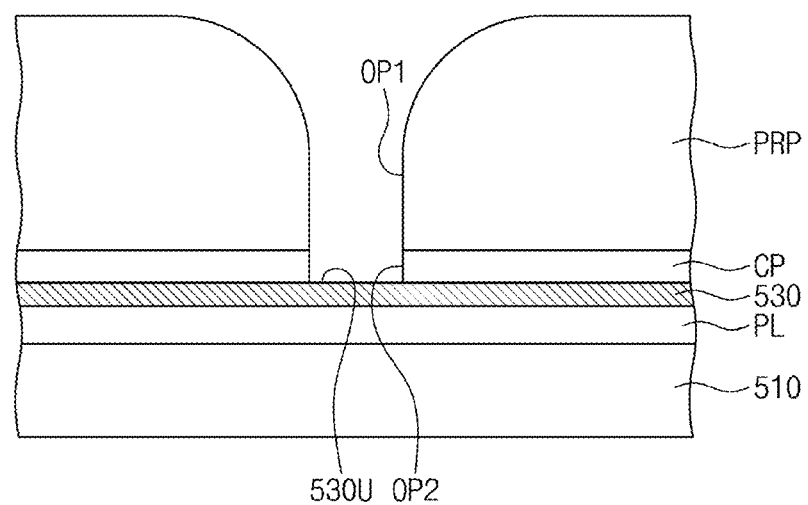
FIGS. 10 to 14 are cross-sectional views respectively illustrating seed films according to exemplary embodiments of the inventive concept.

Referring to FIG. 10, a seed film 2 including a substrate 510, a protection layer PL, a seed layer 530, a capping pattern CP, and a photoresist pattern PRP, which are sequentially laminated, may be provided. The substrate 510 is substantially the same as the substrate 510 described with reference to FIG. 4.

The protection layer PL may cover a top surface 510u of the substrate 510. The protection layer PL may be transparent. The protection layer PL may include an inorganic material or an organic material. For example, the protection layer PL may include an oxide, a nitride, and a combination thereof. For example, the protection layer PL may include any one selected from the group consisting of a zinc oxide, a tin oxide, a silicon oxide, a titanium oxide, a silicon nitride, a zinc-indium-tin-oxide (ZITO), a zinc-tin-oxide (ZTO), an Al-doped ZnO (AZO), a Ga-doped ZnO (GZO), an indium-tin-oxide (ITO), an indium-zinc-oxide (IZO), and a combination thereof.

The seed layer 530 may cover the protection layer PL. In exemplary embodiments, the seed layer 530 may have a thickness W6 of about 10 nm to about 20 nm. The seed layer 530 may include a conductive material. For example, the seed layer 530 may include at least one selected from the group consisting of silver (Ag), a silver alloy (Ag alloy) including aluminum (Al), molybdenum (Mo), gold (Au), palladium (Pd), titanium (Ti), copper (Cu), and a combination thereof. The seed layer 530 may be electrically connected to the first transfer roll 410 in FIG. 1. The seed layer 530 may have the same negative voltage as that of the first transfer roll 410. The photoresist pattern PRP may include a first opening OP1. The top surface 530u of the seed layer 530 may be exposed through the first opening OP1. For example, the photoresist pattern PRP may expose a portion of the top surface 530u of the seed layer 530 and cover another portion of the top surface 530u of the seed layer 530. When the electroplating process is performed on the seed film 2, a conductive layer (not shown) may be provided on the exposed top surface 530u of the seed layer 530.

The capping pattern CP may include a second opening OP2 that has the substantially same width as that of the first opening OP1 of the photoresist pattern PRP. The top surface 530u of the seed layer 530 may be exposed by the first and second openings OP1 and OP2. When an electroplating process is performed on the seed film 3, a conductive layer (not shown) may be provided on the top surface 530u of the seed layer 530.

In exemplary embodiments, the capping pattern CP may include an oxide, a nitride, and a combination thereof. For example, the capping pattern CP may include any one selected from the group consisting of a zinc oxide, a tin oxide, a silicon oxide, a titanium oxide, a silicon nitride, a zinc-indium-tin-oxide (ZITO), a zinc-tin-oxide (ZTO), an Al-doped ZnO (AZO), a Ga-doped ZnO (GZO), an indium-tin-oxide (ITO), an indium-zinc-oxide (IZO), and a combination thereof.

Figure 11:
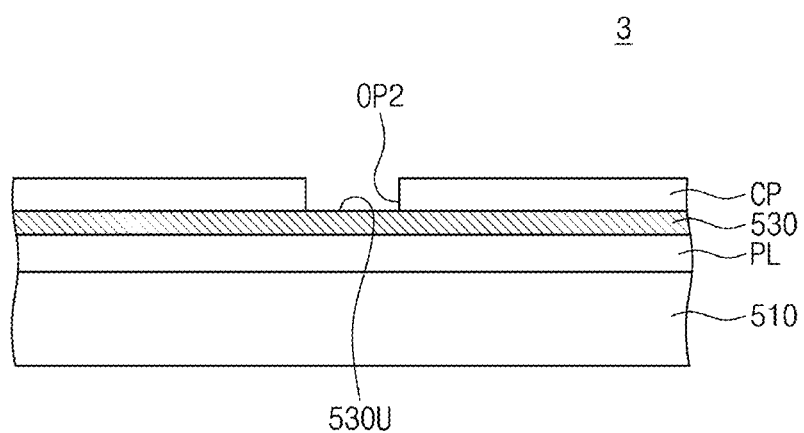

Referring to FIG. 11, unlike FIG. 10, a seed film 3 in which a photoresist pattern PRP is not provided on a capping pattern CP may be provided. The capping pattern CP may include a second opening OP2 exposing the top surface of the substrate 510. When an electroplating process is performed on the seed film 4, a conductive layer (not shown) may be provided on the top surface 530u of the seed layer 530.

Figure 12:
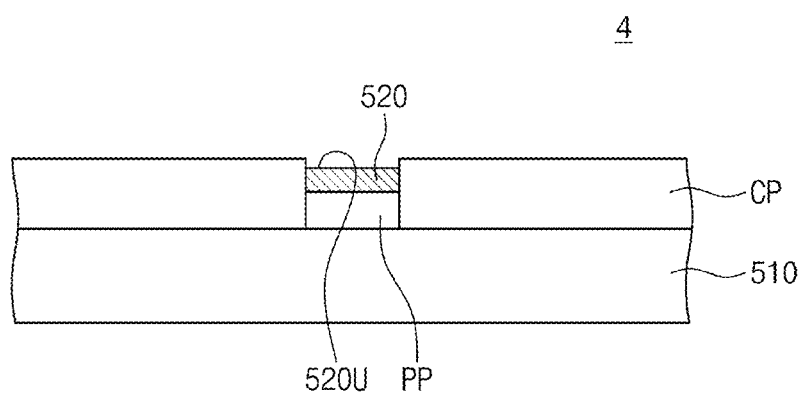

Referring to FIG. 12, a seed film 4 including a substrate 510, a seed pattern 520, a protection pattern PP, and a capping pattern CP may be provided. The protection pattern PP and the seed pattern 520 may be sequentially stacked on the substrate 510. The capping pattern CP may have an opening. The protection pattern PP and the seed pattern 520 may be disposed in the opening. The capping pattern CP may directly contact the top surface 510u of the substrate 510. When an electroplating process is performed on the seed film 4, a conductive layer (not shown) may be provided on the top surface 530u of the seed pattern 520.

Figure 13:
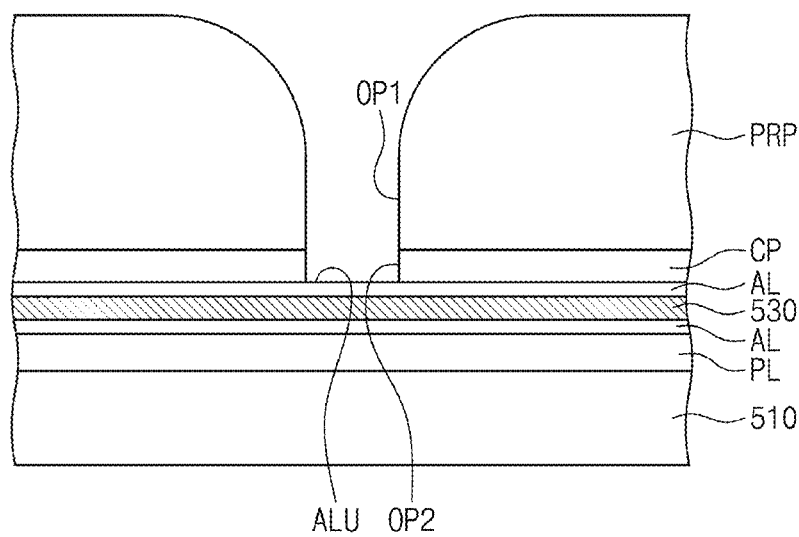

Referring to FIG. 13, unlike FIG. 11, a seed film 5 including a pair of adhesion layers AL. One of the pair of adhesion layers AL may be disposed between a seed layer 530 and a substrate 510. Other one of the pair of adhesion layers AL may be disposed between a seed layer 530 and a photoresist pattern PRP.

The adhesion layer AL may fix the seed layer 530 on the protection layer PL. The adhesion layer AL may be transparent. In exemplary embodiments, the adhesion layer AL may include aluminum (Al), titanium (Ti), chrome (Cr), aluminum nitride (AlN), titanium nitride (TiN), aluminum oxide ($Al_2O_3$), titanium oxide ($TiO_2$), chrome oxide ($Cr_2O_3$), silicon oxide ($SiO_2$, $Si_3O_4$), or a combination thereof.

When an electroplating process is performed on the seed film 5, a conductive layer (not shown) may be provided on the top surface ALU of the adhesion layer AL, which is exposed by a first opening OP1 of a photoresist pattern PRP and a second opening OP2 of a capping pattern CP.

Figure 14:
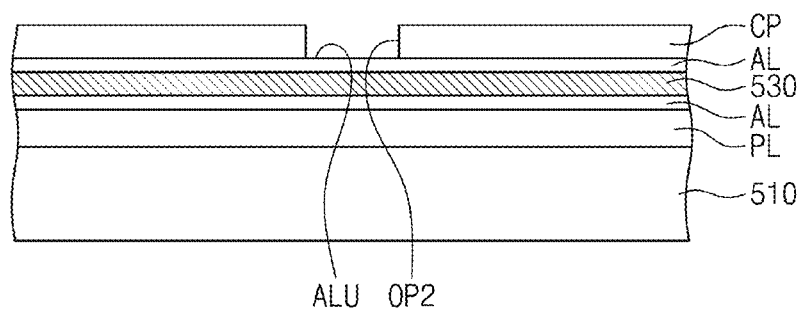

Referring to FIG. 14, unlike FIG. 13, a seed film 6 in which a photoresist pattern PRP is not provided on a capping pattern CP may be provided. When an electroplating process is performed on the seed film 6, a conductive layer (not shown) may be provided on a top surface ALU of a adhesion layer AL, which is exposed by a second opening OP2 of the capping pattern CP.

The seed films 1, 2, 3, 4, 5, or 6 having various structures may be used for the electrode structure fabricating apparatus according to an embodiment of the inventive concept to provide the electrodes.

Figure 15:
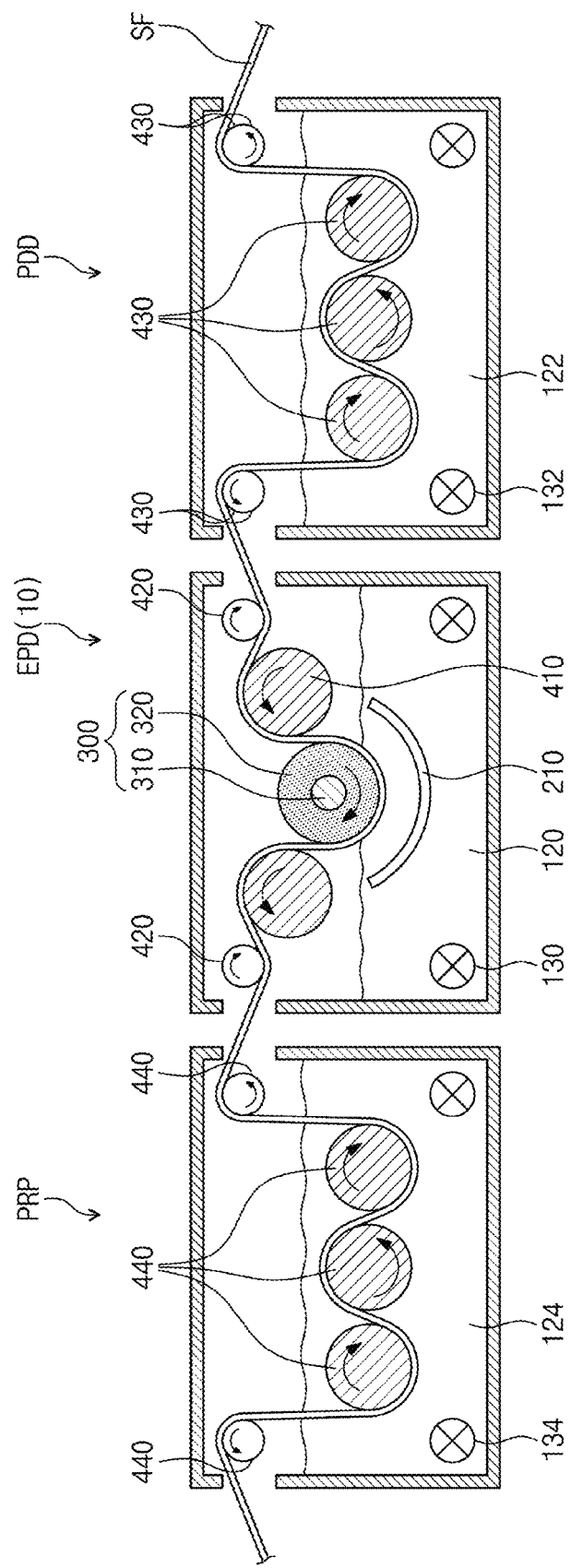
FIG. 15 is a conceptual view of an apparatus for fabricating an electrode structure according to exemplary embodiments of the inventive concept.
Figure 16:
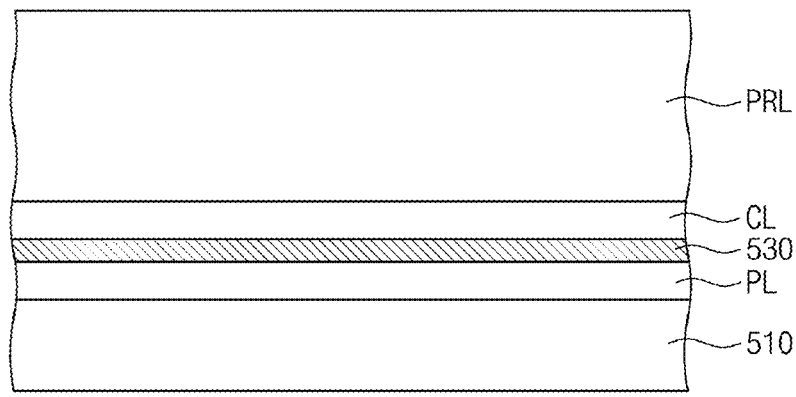
FIGS. 16 to 18 are conceptual views for explaining a method for fabricating an electrode according to exemplary embodiments of the inventive concept.
Figure 17:
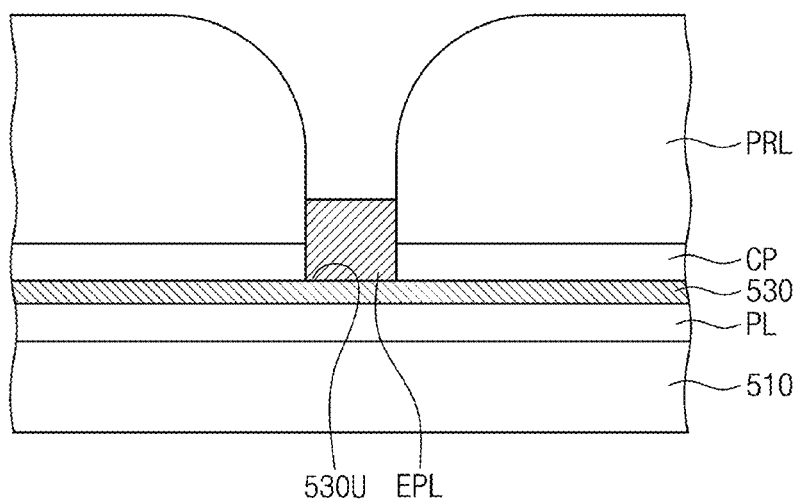
Figure 18:
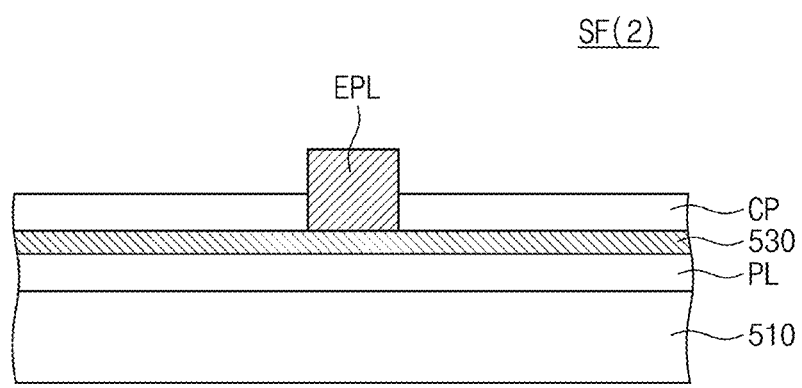

FIG. 15 is a conceptual view illustrating an electrode structure fabricating apparatus according to exemplary embodiments of the inventive concept. FIGS. 16 to 18 are conceptual views for explaining a method for fabricating an electrode according to exemplary embodiments of the inventive concept. For concise description, the substantially same contents as those described with reference to FIGS. 1 to 6 will not be described.

Referring to FIGS. 15 to 18, a photoresist developing device PDD, an electroplating device EPD, and a photoresist removing device PRD, which are arranged in parallel to each other, may be provided. An electroplating device EPD may be substantially the same as the electrode structure fabricating apparatus described with reference to FIGS. 1 to 6. A seed film SF may sequentially pass through the photoresist developing device PDD, the electroplating device EPD, and the photoresist removing device PRD. The seed film SF may be substantially the same as the seed films 1, 2, 3, 4, 5, and 6 described with reference to FIGS. 4 to 6 and 10 to 14. However, hereinafter, the seed layer 530 described with reference to FIG. 10 will be described as an example. Third transfer rolls 430, a developing solution 122, and a developing solution circulation device 132 may be provided in the photoresist developing device PDD. Fourth transfer rolls 440, a removing solution 124, and a removing solution circulation device 134 may be provided in the photoresist removing device PRD.

The seed film SF may be dipped into the developing solution 122 in the photoresist developing device PDD. As illustrated in FIG. 16, the seed film SF that is not dipped into the developing solution 122 may include a substrate 510, a seed layer 530, and a photoresist layer PRL, which are sequentially laminated. The photoresist layer PRL may be exposed. In exemplary embodiments, the photoresist layer PRL may be developed by the developing solution 122 to form the photoresist pattern PRP that is substantially the same as that described with reference to FIG. 10.

Thereafter, the seed film SF may be transferred from the photoresist developing device PDD to the electroplating device EPD. As illustrated in FIG. 17, as an electroplating process is performed on the seed film SF, a plating layer EPL may be formed on a top surface 530u of the seed layer 530, which is exposed by an opening of the photoresist pattern PRP.

Thereafter, the seed film SF may be transferred from the electroplating device EPD to the photoresist removing device PRD. As illustrated in FIG. 18, when the seed film SF passes through the removing solution 124, the photoresist pattern PRP may be removed to expose the plating layer EPL. Thereafter, a following process for forming a capping layer (not shown) on both side surfaces of the plating layer EPL is performed to form the electrode structure.

Since the photoresist developing process for exposing the top surface of the seed layer, the electroplating process for forming the electrode structure on the exposed top surface of the seed layer, and the photoresist pattern removing process are consecutively performed, the electrode structure fabricating apparatus according to an embodiment of the inventive concept may decrease in processing time.

According to the embodiments of the inventive concept, as the uniformity of the electron concentration of the seed layer (or seed pattern) improves, the uniformity of plating may improve.

The effects of the embodiment of the inventive concept should not be construed as limited to the embodiments set forth herein Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An apparatus for fabricating an electrode structure, comprising:
    an electroplating device comprising a high voltage unit, the high voltage unit including a high voltage roll;
    a plating material part facing the high voltage unit;
    a transfer roll to which a negative voltage is applied and provided adjacent to the high voltage roll;
    a first power source coupled to the high voltage roll and configured to apply a first positive voltage from 1 kV to 100 kV to the high voltage roll; and
    a second power source configured to apply a second positive voltage less than 1 kV to the plating material part, the second power source including a positive voltage terminal coupled to the plating material part and a negative voltage terminal coupled to the transfer roll,
    wherein the high voltage unit further comprises:
    an insulation sheath configured to cover a surface of the high voltage roll.

2. The apparatus of claim 1, wherein the plating material part has a curved plate shape.

3. The apparatus of claim 2, wherein a distance between the plating material part and the high voltage roll is constant.

4. The apparatus of claim 2, wherein the plating material part has a uniform thickness.

5. The apparatus of claim 2, wherein the plating material part comprises holes passing therethrough.

6. The apparatus of claim 5, wherein the holes have a surface area that is equal to or less than about 50% of an entire surface area of the plating material part.

7. The apparatus of claim 1, wherein a seed film is disposed between the transfer roll and the high voltage unit and between the high voltage unit and the plating material part, and
    wherein the seed film comprises:
    a substrate: and
    a seed pattern provided on a top surface of the substrate, and
    the seed pattern is electrically connected to the transfer roll and applied with the negative voltage.

8. The apparatus of claim 7, wherein the seed pattern has a thickness of about 10 nm to about 20 nm.

9. The apparatus of claim 7, further comprising:
    a housing surrounding the high voltage unit, the plating material part, and the transfer roll; and
    an electrolyte provided in the housing, and
    a lower portion of the high voltage unit and the plating material part are dipped into the electrolyte.

10. The apparatus of claim 9, wherein the plating material part comprises copper (Cu), and
    the electrolyte comprises a copper sulfate aqueous solution.

11. The apparatus of claim 9, further comprising a circulation device configured to circulate the electrolyte.

12. The apparatus of claim 9, wherein the insulation sheath comprises an insulation material, and
    the high voltage roll is electrically separated from the seed film and the electrolyte by the insulation sheath.

13. The apparatus of claim 1, further comprising:
    a photoresist developing device; and
    a photoresist removing device,
    a seed film is disposed in the photoresist developing device, the electroplating device, and the photoresist removing device, and
    the seed film is controlled to sequentially pass through the photoresist developing device, between the transfer roll and the high voltage unit, between the high voltage unit and the plating material part, and the photoresist removing device.

14. The apparatus of claim 1, further comprising a seed film provided between the insulation sheath and the plating material part, the seed film including a seed pattern and a substrate, the seed pattern having a grid shape on a top surface of the substrate.

15. The apparatus of claim 1, wherein a distance between the plating material part and the high voltage roll is in a range about 5 mm to about 500 mm.

16. The apparatus of claim 1, wherein the plating metal part has a thickness in a range from about 0.5 mm to about 10 mm.

17. The apparatus of claim 1, wherein the first power source is configured to apply a direct current (DC) voltage as the first positive voltage to the high voltage roll.

18. The apparatus of claim 1, wherein the first power source and the second power source are spaced apart from each other.

* * * * *